United States Patent
Kitchen

(10) Patent No.: US 7,339,180 B2
(45) Date of Patent: Mar. 4, 2008

(54) PARTICLE BEAM CURRENT MEASUREMENT SYSTEM

(75) Inventor: Richard L. Kitchen, Madison, WI (US)

(73) Assignee: National Electrostatics Corp., Middleton, WI (US)

( * ) Notice: Subject to any disclaimer, the term of this patent is extended or adjusted under 35 U.S.C. 154(b) by 210 days.

(21) Appl. No.: 11/378,527

(22) Filed: Mar. 17, 2006

(65) Prior Publication Data

US 2007/0215814 A1    Sep. 20, 2007

(51) Int. Cl.
*H01J 37/244* (2006.01)

(52) U.S. Cl. .................... 250/397; 250/283

(58) Field of Classification Search ............... 250/397, 250/283, 281, 282
See application file for complete search history.

(56) References Cited

U.S. PATENT DOCUMENTS 6,583,421 B2 *  6/2003  Harvey ........................ 250/397

OTHER PUBLICATIONS

"A Fast Beam Pulsing System for Isotope Ratio Measurements", Martin Suter, Richard Balzer, George Bonani and Willy Wölfli, reprinted from Nuclear Instruments & Methods in Physics Research, Section B vol. 233 [B5], No. 2, Nov. 1984, pp. 242-246.

"A Current Integrator for an Electrostatic Accelerator Energy Scale Calibration System" A.G. Nagomyi, Instruments and Experimental Techniques, vol. 45, No. 1, 2002, pp. 58-60.

"Eliminating Output Offset" Nonlinear Op-Amp Circuits, Chapter 22, pp. 829-830.

"Opamp Integrator" circuit diagram, http://www.ecircuitcenter.com/Circuits/opint/opint.htm Printed from website Jan. 11, 2006, 4 pp.

"Pulse Amplitude Measurement", http://ww.atomki.hu/atomki/Electr/pulseamplitudemeasurement.htm.

"Outline of DAQ for 30 Ghz High Power Processing" H.H. Braun, J. Sladen and W. Wuensch, CERN—European Organization for Nuclear Research European Laboratory for Particle Physics, Geneva, Switzerland Sep. 30, 2004, 5 pp.

"Digital Current Integrator 439" ORTEC® company pamphlet, 2 pp.

* cited by examiner

*Primary Examiner*—Kiet T. Nguyen
(74) *Attorney, Agent, or Firm*—Stiennon & Stiennon

(57) ABSTRACT

A method and apparatus for measuring the beam current of a particle beam in an accelerator by charging the capacitor across an operational amplifier and controlling the scaling of the amplifier output with a programmable gain amplifier (PGA). The out put of the (PGA) is sampled and storing with an analog-to-digital converter to acquire and store at least two digital voltage values. The two digital voltage values are using to obtain a value proportional to beam current. A field programmable gate array is used to implement digital logic to sample and hold output from the analog-to-digital converter.

13 Claims, 4 Drawing Sheets

PARTICLE BEAM CURRENT MEASUREMENT SYSTEM

CROSS REFERENCES TO RELATED APPLICATIONS

Not applicable.

STATEMENT AS TO RIGHTS TO INVENTIONS MADE UNDER FEDERALLY SPONSRED RESEARCH AND DEVELOPMENT

Not applicable.

BACKGROUND OF THE INVENTION

The present invention relates to devices used with a particle beam for measuring beam current with a Faraday cup in general, and in particular to systems which determine the beam currents of two or more different particle beams using the same Faraday cup.

A beam of accelerated particles is useful in many scientific and industrial applications, from ion implantation for controlling material properties, to investigating fundamental principles of physics, to accurately dating ancient materials or following chemical reactions or fluid flows by monitoring isotope ratios. A mass spectrometer is one widely used application of particle beams. A mass spectrometer can be used to detect the ratio between the isotopes of a particular element. When one of the isotopes is radioactive, it typically has a low abundance in the environment because it must be constantly supplied from a source, such as the atmosphere or a parent radioactive material, or it disappears over time. Thus it is possible to date a material from the time the material was removed from a source of a radioactive isotope e.g., carbon-14 in the atmosphere. Various chemical and biological processes can cause a separation of isotopes, so that measurement of non-radioactive isotope ratios can be used to determine the diet of ancient animals from their remains, as well as the temperature or other conditions under which they lived.

One of the most widely used isotope determinations is for $^{14}$C. Carbon-14 is constantly generated in the upper atmosphere through the interaction of neutrons produced by cosmic rays with Nitrogen 14. $^{14}$C forms carbon dioxide which taken up by plant life and so is incorporated into all living things. The amount of radioactive $^{14}$C in the atmosphere has remained relatively stable over a period of thousands of years. However, once living matter dies, it no longer exchanges carbon with the atmosphere and so the amount of $^{14}$C gradually decreases in accord with the half-life of $^{14}$C of about 5,730 years. By determining the ratio of $^{14}$C to non-radioactive $^{12}$C and $^{13}$C in an ancient sample, and comparing with the same ratio in a modem carbon sample from living material, it is possible to determine how many years have transpired since the source of the carbon in the ancient sample died.

Since the late 1970s tandem electrostatic accelerators have been used as extremely sensitive mass spectrometers able to distinguish the atomic isotopic ratios of 17 orders of magnitude or more. For example, in a modem sample of carbon the ratio is $1.35 \times 10^{-12}$ between carbon-12 and carbon-14. Radioactive isotopes with long half-lives are difficult to measure by detection of radioactive decay if the sample size is small and the half-life of the radioactive isotope is large. For radioactive carbon-14, with a half-life of 5,730 years, a sample size of about one gram is generally considered necessary for conventional radioactive carbon dating. A one-gram sample of modem carbon contains approximately $10^{-12}$ grams $^{14}$C or approximately $5 \times 10^{10}$ atoms of $^{14}$C and produces only 14 disintegrations per minute. By using an accelerator mass spectrometer (AMS), as much as 10 percent of the atoms of $^{14}$C present in a sample can be directly detected. The result is that the concentration of $^{14}$C can be measured with a precision of better than one percent in a modem sample, using a sample size of less than one milligram in only a few minutes. The ability to uniquely detect the presence of atomic isotopes finds many uses beyond carbon dating, for example using atomic isotopes as chemical labels.

Mass spectrometry uses the principal that a charged particle is deflected more or less by a magnetic or static electric field depending on the velocity and mass of the particle. By the proper combination of magnetic and/or electrostatic analyzers it is possible to separate particles by mass and charge and thus to detect the mass and energy of individual particles. The unique detection of a particular atomic isotope, however, requires that all molecular isobars be eliminated. For example, in the case of $^{14}$C molecular isobars of $^{13}$CH and $^{12}$CH$_2$ are perhaps one million times more prevalent than the $^{14}$C to be measured. To detect $^{14}$C, negatively charged particles of mass 14 are accelerated in the tandem accelerator through a potential of about one-half million volts to several million volts. The negatively charged particles of mass 14 are passed through a stripping column of rarefied gas in the high voltage positively charged electrode. The stripping column causes the particles to lose electrons and in the process breaks up any molecular isobars into their constituent parts. The positively charged ions are accelerated away from the positively charged high voltage electrode to ground and the particles of mass 14 are separated and counted.

The isotopes of carbon occurring in nature are approximately 99 percent $^{12}$C, 1 percent $^{13}$C, and $10^{-13}$ percent $^{14}$C. To obtain accurate determinations the amount of $^{14}$C present it is necessary to compare the amount of $^{14}$C detected to the amount of $^{13}$C and $^{12}$C present in the sample because it is the ratio, not the absolute amount of $^{14}$C which is of interest. The amount of each carbon isotope measured while substantial is only about 10 percent of that which was originally contained in the sample. To obtain accurate results it is necessary to precisely measure the relative abundance of all three isotopes to account for all the loss mechanisms, which can effect the different isotopes of Carbon differently. In order to minimize the amount of power consumed by the high voltage electrode and minimize generation of radiation, it is desirable to minimize the beam currents which are accelerated. This is typically accomplished by accelerating the $^{12}$C, and $^{13}$C only for short periods of time between longer periods of time during which the $^{14}$C beam is injected and analyzed.

To minimize the overall size of the beam transport system on the injection side of the accelerator, a single Faraday cup which receives both the $^{12}$C and $^{13}$C beams can be utilized. It has also been known to use two parallel analog circuits to measure the beam current supplied to the common Faraday cup. Compensation for the differences in beam current between the $^{13}$C and the $^{12}$C is done by reducing the relative length of the $^{12}$C beam pulse with respect to the $^{13}$C beam pulse. Prior art analog integration circuits used several operational amplifiers which added to offset and gain errors, as well as limited gain adjustments. What is needed is a more accurate and flexible circuit for measuring beam currents over a wide range of beam currents.

SUMMARY OF THE INVENTION

The beam current measuring method and device of this invention forms a precision pulse current integrator (PPCI) which includes a Faraday cup connected in current supplying relation to an integration capacitor connected between the inverting input and the output of an operational amplifier. The output of the operational amplifier is zeroed by a switch across the capacitor. A trigger pulse opens the switch across the capacitor and the integration capacitor begins to charge in response to a first beam current supplied to the integration capacitor from the Faraday cup. As the capacitor charges, the operational amplifier outputs a ramp voltage which is sent to a programmable gain amplifier (PGA). The output of the programmable gain amplifier is supplied to an analog-to-digital converter (ADC). The ADC is triggered at a time slightly after the beam current begins to accumulate on the integration capacitor, and the value determined by the ADC is stored in a first data register. After a first selected time the ADC is again triggered by a second trigger, and the value of the ADC corresponding to the second trigger is stored in a second data register. Logic contained in a programmable gate array (PGA) which forms a part of the precision pulse current integrator (PPCI) produces a measurement, which is a voltage corresponding to the definite integral of the beam current over the selected time, by subtracting the value of the first data register from the value of the second data register. The logic supplies the first beam current integration measurement to a first-in first-out (FIFO) memory. Following integration of the first signal, the integration capacitor is again zeroed by closing the switch across the capacitor. The first beam current integration measurement is divided by the time of integration i.e., the first selected time, to obtain beam current.

A programable current source forms part of the current beam measuring device and is used to build a calibration table for the instrument. The calibration table contains the "effective" capacitance for each current measurement range as well as correction factors for removing small gain and offset errors in the PGA and the rest of the electronics.

The beam current measuring device has three ways in which the voltage range can be scaled to best take advantage of the most accurate portion of voltage range of the analog-to-digital converter, e.g. the upper half of the range. Two of these, the size of the integration capacitor, and the programmed gain of the PGA, are adjustable during setup. The third way, the voltage range can be scaled by adjusting the length of time during which beam current is integrated. This third way can be adjusted rapidly so the sequential beam pulses can be scaled with respect to each other. Adjusting the length of beam current integration time allows a second beam of substantially lower current to be captured by the Faraday cup and applied to the same integration capacitor and subjected to the same gain in the programmable gain amplifier while making full use of the most accurate portion of voltage range of the analog-to-digital converter. The time selected for integration of the second beam current is selected approximately proportionately greater or less than the first selected time, as the beam current is proportionately greater or less. As described with respect to the first beam current integration measurement, a second beam integration measurement is supplied to a second FIFO memory.

It is a feature of the present invention to provide a beam current monitoring circuit with increased beam current range adjustment.

It is another feature of the present invention to provide a method of more accurately measuring beam current associated with an accelerated particle beam.

It is a further feature of the present invention to provide a beam current monitoring circuit which is better adaptable to an integrated implementation as opposed to a discrete implementation.

It is yet another feature of the present invention to provide a beam current monitoring circuit which minimizes analog components.

It is yet a further feature of the present invention to provide a beam current monitoring circuit in which two beam currents can be compared using with the same analog circuit components.

Further objects, features and advantages of the invention will be apparent from the following detailed description when taken in conjunction with the accompanying drawings.

DESCRIPTION OF THE PREFERRED EMBODIMENTS

Figure 1:
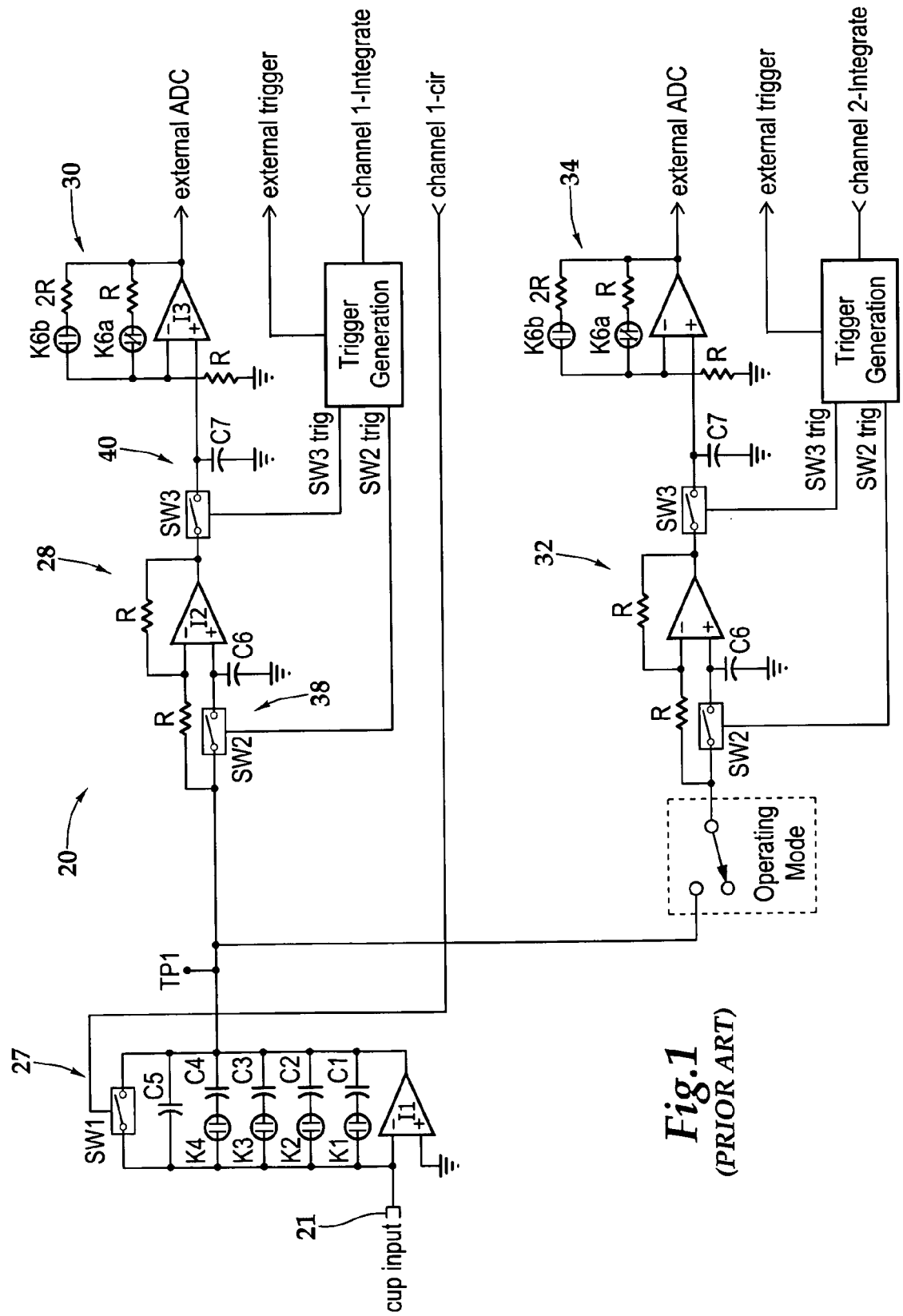
FIG. 1 is a schematic view of a prior art beam current measuring system based on analog components.
Figure 2:
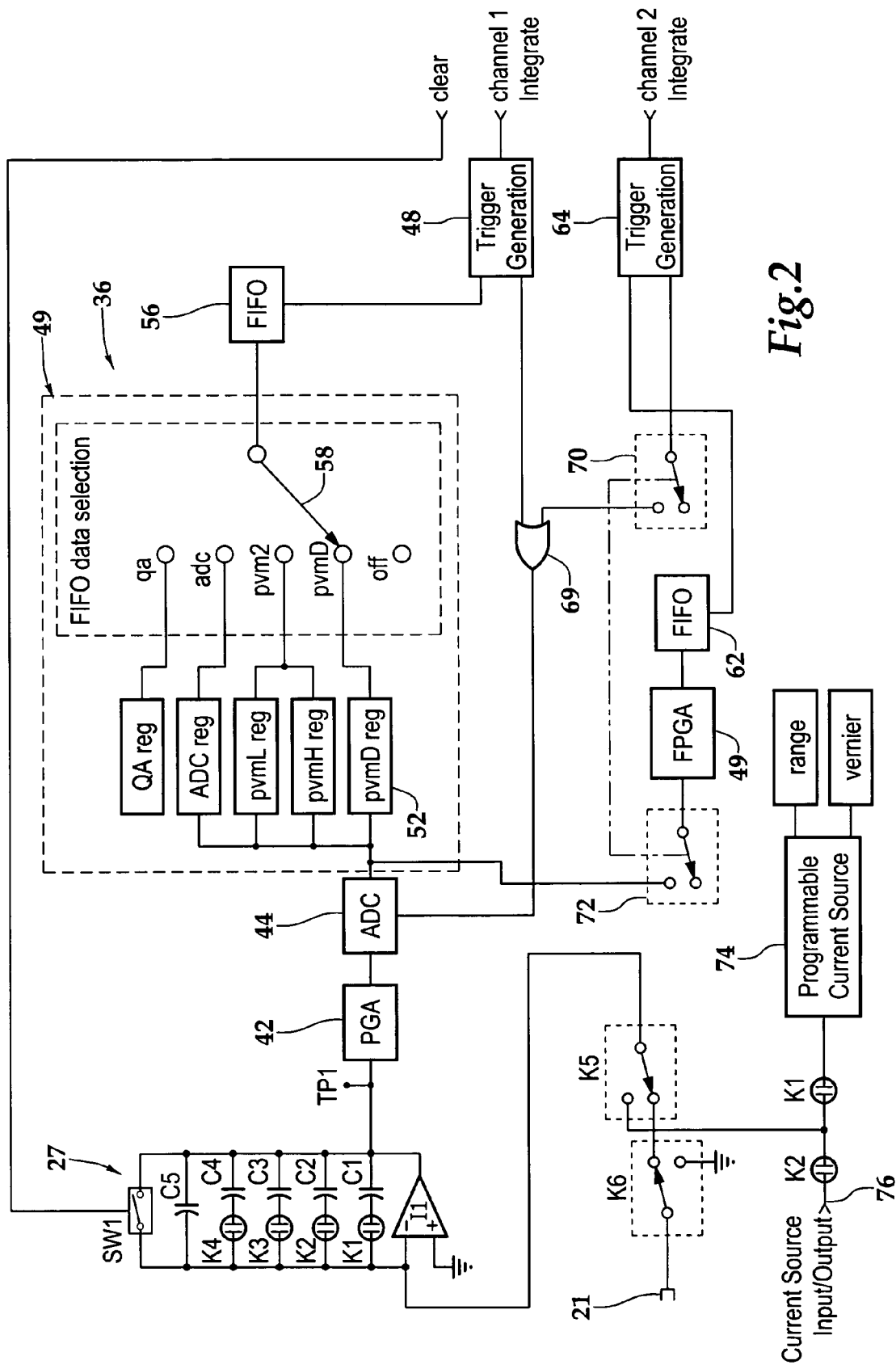
FIG. 2 is a schematic view of the beam current measuring system of this invention.
Figure 3:
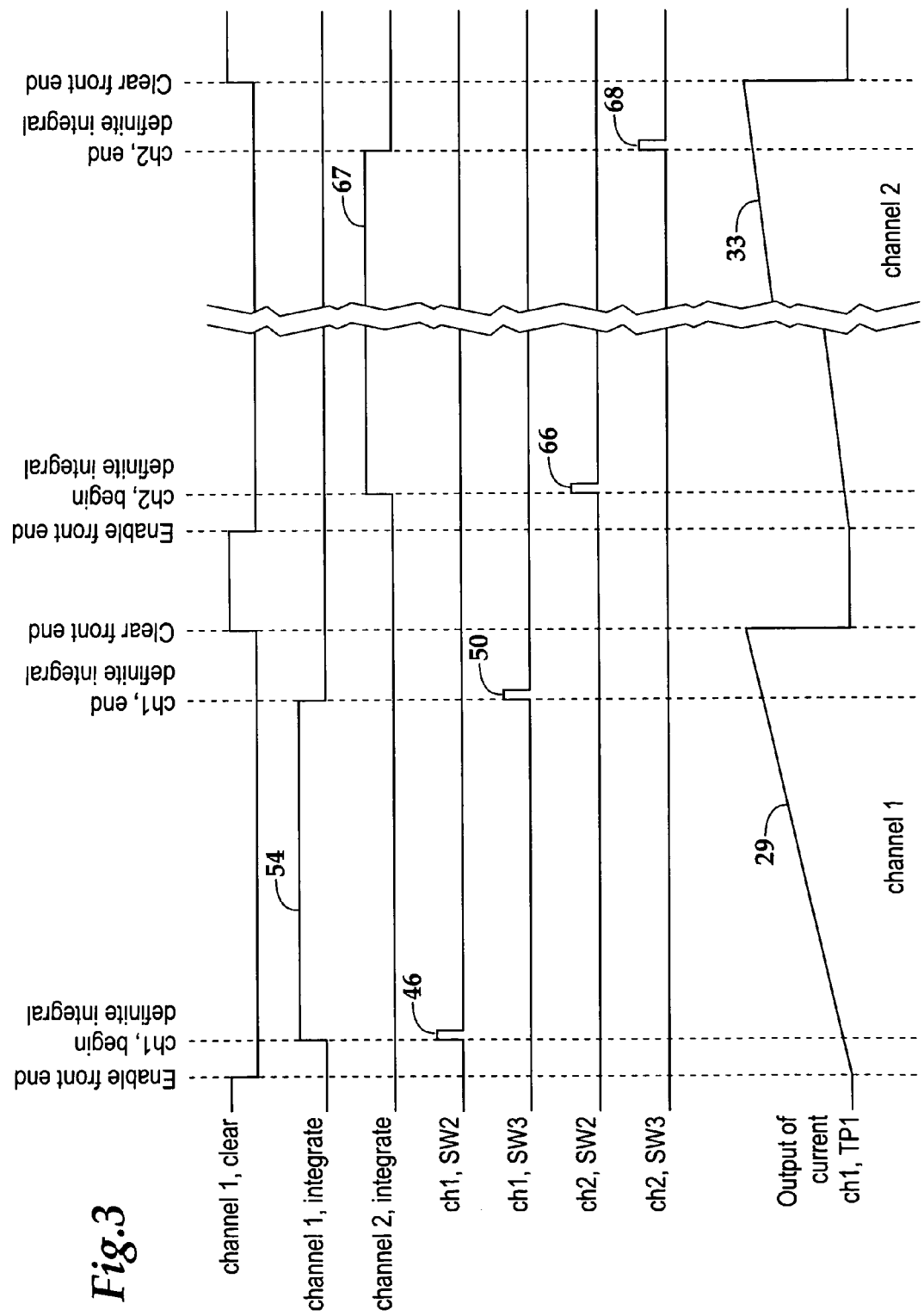
FIG. 3 is a schematic view of the control and measured waveforms of the beam measuring system of FIG. 2.
Figure 4:
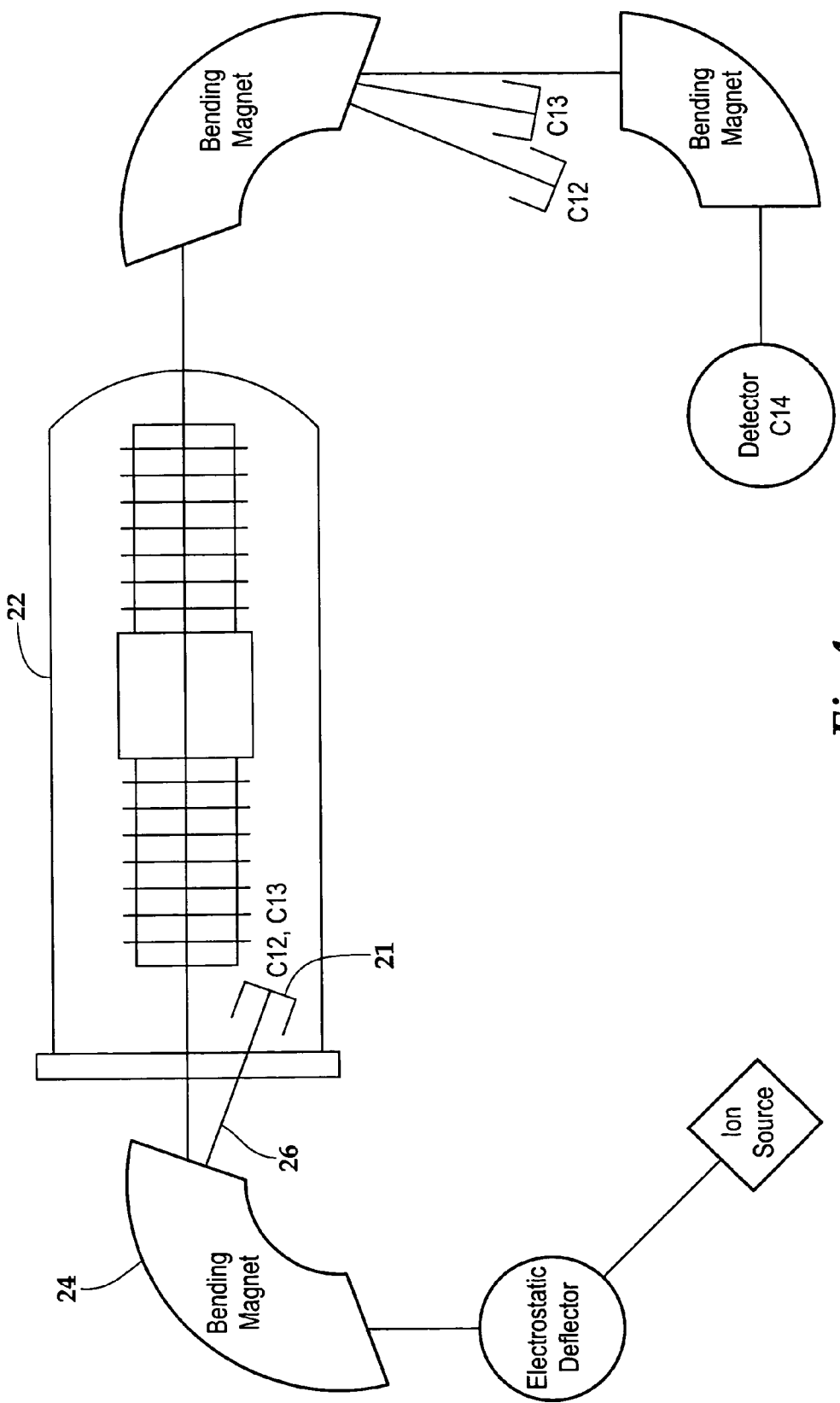
FIG. 4 is a schematic plan view of a tandem electrostatic accelerator used for $^{14}C$ dating.

Referring more particularly to FIGS. 1-4 wherein like numbers refer to similar parts, a prior art beam current measuring device 20 is shown schematically in FIG. 1. The prior art device 20 employs an analog circuit design to store voltages and to integrate beam current. A Faraday cup 21 in an accelerator 22, as shown in FIG. 4, is arranged to receive a charged particle beam 26 by control of a bending magnet 24. The charge on the accelerated ions forming the particle beam 26 produces a current which flows from the Faraday cup to the inverting input of the operational amplifier I1 which forms part of a current integrator circuit 27 as shown in FIG. 1. An array of capacitors C1-C5 is connected in parallel between the operational amplifier inverting input and the operational amplifier output, and the capacitors are arranged to be controlled by switches K1-K4 to select a combination of capacitors for a particular integrator range. A switch SW1 is also arranged in parallel with the capacitors, and the switch SW1 is closed to zero the current integrator by shorting out the capacitors and causing whatever charge is injected into the circuit 27 to be drained to virtual ground formed by the inverting input of I1.

At the beginning of an integration cycle, switch SW1 is opened. If there is current present from a particle beam entering the Faraday cup 21, then the integration capacitance e.g., C5 begins to charge. As charge builds up on the integration capacitance, it causes the output voltage of the operational amplifier I1 to increase forming a voltage ramp 29 shown in FIG. 3. A definite integral circuit 28 samples the ramp 29 at two different points and subtracts the two values from each other to produce a delta voltage. The combination of SW2 and C6 form a first sample and hold circuit 38. A first control pulse causes SW2 to close momentarily, recording the voltage at the point on the ramp where the pulse occurred. The ramp voltage continues to increase and the output of I2 now provides the voltage difference between the present value of the ramp 29 and the value sampled by C6. A second control pulse is sent to a second sample hold circuit 40, formed by the combination of SW3 and C7. The value held by C7 is the definite integral, i.e. the voltage change which took place during the period of time between the first and second control pulses. A gain circuit 30 follows the second sample and hold circuit 40 to increase the gain of the definite integral circuit output. The gain circuit 30 uses a third op amp I3 which is used to provide additional x1 or x2 gain which is selected by switches K6a and K6b. The combination of ranges of capacitors C1-C5 and the gain circuit 30 together provide the beam current measuring device 20 with 10 operating ranges. The final voltage value from the output of the third operational amplifier I3 is sent to an external ADC.

A second particle beam of substantially different beam current can be collected by the same Faraday cup 21, a second definite integral circuit 32, and a second gain circuit 34. The second definite integral circuit 32 can be used with a longer integration time so that the lesser slope (i.e. the lesser beam current of the second particle beam) produces a voltage ramp 33 which reaches a value of approximately the same magnitude as the first voltage ramp 29 as shown in FIG. 3. Thus two different particle beams can be measured with the same Faraday cup 21 and integrator circuit 27. The current integrator circuit 27 uses a "clear" signal provided by another system (not shown) which controls the timing and duration of the "clear" signal. The definite integral circuit 28 uses "ch1 begin definite integral" and "ch1 end definite integral integrate" and circuit 32 uses "ch2 begin definite integral" and "ch2 end definite integral" shown in FIG. 3, which control the timing and duration of the "integrate" signals.

The prior art beam current measuring device 20, while functional, suffers from a number of limitations. It is very difficult to eliminate the offset and gain errors of the analog circuit because of the number of op amps involved. Both gain and offset errors are of importance because they contribute to a problem which is sometimes described as the "bathroom scale problem." This occurs in inexpensive scales of the type used at home in the bathroom. The scale is reasonably calibrated over some range of weight values, but is not well calibrated above or below the good part of the range. In the same way the problem encountered when trying to design a pulse integrator using the prior art is that gain and offset error are difficult to correct over the entire range of measurement. Offset error is particularly a problem when voltages are at the lower end of the ranges of the analog circuits because then offset error contributes more to the measured value.

The precision pulse current integrator (PPCI) 36, shown in FIG. 2, solves the problem by eliminating most of the analog circuitry and digitizing the signal as soon as possible. The precision pulse current integrator (PPCI) 36 has a Faraday cup 21 and a current integrating circuit 27, similar to those used in the prior art as shown in FIG. 1. However the remaining circuits of the device 36 are different. A programmable gain amplifier (PGA) 42 is connected to the output of op amp I1 of FIG. 2 and scales the output voltage by a programmed amount (e.g., a power of two: 1, 2, 4, 8) so as to provide an output voltage better matched to an analog-to-digital converter (ADC) 44, which is in voltage receiving relation to the PGA 42. Better matching of the input voltage by the PGA 42 to the ADC 44 results in better accuracy in the output of the ADC, i.e. the input voltage to the ADC is scaled to the range of the ADC for better accuracy. The ADC is controlled via a control signal 46, shown in FIG. 3, from a trigger generator 48 shown in FIG. 2. At the rise of the control signal 46 the ADC converts the voltage received from the PGA into a digital word which is sent to a field programmable gate array (FPGA) 49 which stores the value in a data register identified as, present value monitor Low (pvmL) in FIG. 2.

The timing of the control signals shown in FIG. 3 are controlled by a master clock and controller represented by FIG. 3 generally, and the clock-based timing signals shown therein. The clock for example employs a 4 MHz crystal controlled time base which provides 0.25 µs/step resolution, and thus integration times employed for the beam current measurements with respect to the accelerator 22 are all based on the same clock. After the passage of a selected period of time 54, as shown in FIG. 3, a second control signal 50 shown in FIG. 3 is sent from the trigger generator 48 to the ADC 44 as shown in FIG. 2. Again the rising voltage of the control signal 50 causes the ADC to convert the voltage received from the PGA 42 into a digital word which is sent to the FPGA 49 which stores the value in a data register identified as present value monitor High (pvnH) in FIG. 2. The FPGA 49 which forms a definite integral circuit which subtracts the value stored in the pvmL data register from the value stored in the pvmH data register, using hardware math, and stores the result in a third result data register identified as present value monitor Difference (pvmD). The value stored in the pvmD data register represents the definite integral of the current received by the Faraday cup 21 over the selected time period 54. The digital contents of the pvmD data register is sent to a first-in first-out (FIFO) memory 56 by means of a data selection switch 58 which is normally set with a data selection pointer set to the pvmD data register as shown in FIG. 2. The FIFO memory 56 is loaded from the FPGA in response to a control pulse from the trigger generator 48.

As shown in FIG. 2, a second beam current can be measured with a second definite integral circuit 49 and a second FIFO memory 62 under the control of a second trigger generator 64. The second trigger generator 64 supplies second voltage sample triggers 66, 68 separated by a second selected time 67 to an OR gate 69 which issues trigger signals to the ADC 44 from either the first trigger generator 48 or the second trigger generator 64. As shown in FIG. 2, operating mode switches 70, 72 switch the second trigger generator, and the second FPGA 49 so as to operate with the Faraday cup 21, the current integrating circuit 27, and the ADC 44. Alternatively, a second Faraday cup (not shown), a second PGA (not shown), and a second ADC (not shown) can be selected with the operating mode switches 70, 72 to form a separate independent beam current measuring device. Advantageously, the same front-end electronics, including the analog components, are used for each of two different beam currents alternatively received by the same Faraday cup 21. The current integrator circuit 27 of FIG. 2 uses a "clear" signal provided by the clock system as shown in FIG. 3 which controls the timing and duration of the "clear" signal. The ADC uses an "integrate" signal provided by the clock system as shown in FIG. 3 which controls the timing and duration between ADC trigger signals.

The FPGA 49 has additional data registers which can be selected by the data switch 58 and read out into the FIFO memory 56 to provide diagnostics during manufacture or use. Possible selections shown in FIG. 2 are:

off—nothing is loaded into the FIFO pvm2—two words, making up the contents of the pvmL and pvmh data registers are loaded ADC—each time the ADC completes a conversion, the contents of the ADC data register are loaded into the FIFO.

QA—the QA data register is loaded with a value; each time a FIFO trigger instruction is sent to the definite integral circuit 49 the contents of the QA data register are copied to the FIFO.

pvm—the setting normally used for beam current data collection.

The "QA" settings allow software testing of the FIFO logic during manufacturing. The "ADC" and "pvm2" settings may be used for other diagnostics.

The gain and offset error contribution from the Programmable Gain Amplifier (PGA) 42 and the analog-to-digital converter (ADC) 44 are very low because the programmable gain amplifier and the analog-to-digital converter, contain resistors on which laser trimming is utilize to minimize the gain and offset errors. Further gain and offset errors are reduced or eliminated by calibration with a programmable current source 74. The programmable current source 74 is arranged to supply a precise test current in place of the current from the Faraday cup input 21. The programmable current source may have, for example, six current ranges between ±ten nanoAmp (10 nA) and ±one milliAmp(1 mA). The current source 74 is calibrated with a precise external ammeter. The same current source 74, via an auxiliary output jack 76, allows coupling of two or more precision pulse current integrators (PPCI) together to facilitate calibration from one common current source. Thus one current source can be used to calibrate all the precision pulse current integrators used on the accelerator 22 shown in FIG. 4. Because the desired output is a ratio between beam currents, errors in the calibration of the beam current caused by the programmable current source 74 cancel out.

The current source 74 uses with a calibration table which is built and loaded at the factory by using a computer controllable picoammeter (for example a Keithley 486, available from Keithley Instruments, Inc., of Cleveland) to measure the current of the current source 74 while a calibration table is created. The table is stored in flash memory and is read as needed. The calibration table is used to determine the correct Range and Vernier inputs to apply to the current source 74 so the user selected current is provided.

It should be understood that three or more different beam pulses could be monitored by the beam current monitoring device by adding additional computation and memory capabilities or by reusing existing circuitry.

It should be understood that other logic implementations/technologies for the PPCI such as an application-specific integrated circuit ASIC, could be used in place of the field programmable gate array.

It is understood that the invention is not limited to the particular construction and arrangement of parts herein illustrated and described, but embraces all such modified forms thereof as come within the scope of the following claims.

I claim:

1. A particle beam current measuring device comprising:
    a Faraday cup;
    an integrator circuit in current receiving relation to the Faraday cup;
    a programmable gain amplifier connected in voltage receiving relation to the integrator circuit and in voltage supplying relation to an analog-to-digital converter;
    a first trigger generation circuit in trigger supplying relation to the analog-to-digital converter, arranged to supply a first trigger signal and a second trigger signal separated by a selected time interval;
    a plurality of data registers including at least a first data register and a second data register, the first data register arranged to receive a first digital voltage level when the analog-to-digital converter receives the first trigger signal, the second data register arranged to receive a second digital voltage level when the analog-to-digital converter receives the second trigger signal;
    a third data register connected to the first data register and the second data register by logic which operates to subtract the first data register from the second data register, and to enter a difference value into the third data register; and
    FIFO memory in data receiving relation to said third data register.

2. The particle beam current measuring device of claim 1 further comprising a programable current source, switchable into current receiving relation to the programmable gain amplifier.

3. The particle beam current measuring device of claim 1 wherein the FIFO memory is in data receiving relation to the third data register by a selector which is arranged to selectively receive data from each of said plurality of data registers.

4. The particle beam current measuring device of claim 1 further comprising:
    a second trigger generation circuit in trigger supplying relation to the analog-to-digital converter along with the first trigger generation circuit through an OR circuit, the second trigger generation circuit arranged to supply a second first trigger signal and a second second trigger signal separated by a selected time interval;
    a second plurality of data registers including at least a first register, and a second register, the first data register arranged to receive a first digital voltage level when the analog-to-digital converter receives the second first trigger signal, the second data register arranged to receive a second digital voltage level when the analog-to-digital converter receives the second second trigger signal;
    a third data register connected to the first data register and the second data register by logic which operates to subtract the first data register from the second date register, and enter a difference value into the third data register; and
    second FIFO memory in data receiving relation to said third data register.

5. A particle beam accelerator and current measuring device comprising:
    a particle beam accelerator;
    a plurality of Faraday cups in the particle accelerator, arranged to receive accelerated particle beams;
    for each Faraday cup of the plurality of Faraday cups a current integrator means in current receiving relation to said each Faraday cup;
    for each current integrator means a programmable gain amplifier means connected in voltage receiving relation therewith and voltage supplying relation to an analog-to-digital converter;
    for each analog-to-digital converter a trigger generation means in trigger supplying relation therewith, and arranged to supply a first trigger signal and a second trigger signal separated by a selected time interval; and
    for each analog-to-digital converter a means connected to subtract a first output from a second output and produce a value corresponding to an integration of particle beam current over the selected time interval.

6. The particle beam accelerator and current measuring device of claim 5, further comprising a memory means in data receiving relation to the means connected to subtract, said memory means for storing a value corresponding to an integration of particle beam current over the selected time interval.

7. The particle beam accelerator and current measuring device of claim 5, further comprising a single current source means switchable into current supplying relation to said each current integrator means so each programmable gain amplifier means and each analog-to-digital converter can be calibrated with the same current source.

8. The particle beam accelerator and current measuring device of claim 5 further comprising a single means for controlling a time base so that each selected time interval is comparable to every selected time interval.

9. A particle beam current measuring device comprising:
a Faraday cup;
a current integrating means switchable into current receiving relation to the Faraday cup;
a digital gain amplification means connected in voltage receiving relation to the current integrating means and in voltage supplying relation to an analog-to-digital converter means;
a trigger generation means in trigger supplying relation to the analog-to-digital converter means, arranged to supply a first trigger signal and a second trigger signal separated by a selected time interval;
a plurality of data storage means including at least a first data register and a second data register, the first data register arranged to receive a first digital voltage level from the analog-to-digital converter means when the analog-to-digital converter means receives the first trigger signal, the second data register arranged to receive a second digital voltage level from the analog-to-digital converter means when the analog-to-digital converter means receives the second trigger signal; and
a subtracting means connected to the first data register, and the second data register to produce a value corresponding to an integration of particle beam current over the selected time interval.

10. The particle beam current measuring device of claim 9 further comprising a programable current source, switchable into current receiving relation to the current integrating means.

11. The particle beam current measuring device of claim 9 wherein a FIFO memory in data receiving relation by a selector which is arranged to selectively receive data from each of said plurality of data registers.

12. A method of measuring beam current in a particle beam accelerator, comprising the steps of:
collecting a particle beam in a Faraday cup to produce a current and applying said current to a current integration means to produce a first voltage;
amplifying the first voltage from the current integration means with a digital gain amplifier;
converting the amplified first voltage at a first time to a first digital value;
converting the amplified first voltage to a second digital value at a second time which is a selected interval of time after the first time; and
subtracting the first digital value from the second digital value to yield a difference value, and dividing the difference value by the selected time interval to thus determine beam current.

13. The method of claim 12, further comprising applying a known calibration current to the current integration means and continuing to apply said current from the first time through the second time, such that the determined beam current is a calibration current.

* * * * *